US012635448B2

(12) United States Patent
Kang

(10) Patent No.: US 12,635,448 B2
(45) Date of Patent: May 19, 2026

(54) HIGH HEAT CAPACITY HOT PLATE

(71) Applicant: Tokyo Electron Limited, Tokyo (JP)

(72) Inventor: Hoyoung Kang, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 765 days.

(21) Appl. No.: 17/989,333

(22) Filed: Nov. 17, 2022

(65) Prior Publication Data

US 2024/0170307 A1 May 23, 2024

(51) Int. Cl.
| *H10P 72/00* | (2026.01) |
| *H05B 1/02* | (2006.01) |
| *H05B 3/12* | (2006.01) |
| *H05B 3/14* | (2006.01) |
| *H10P 72/76* | (2026.01) |

(52) U.S. Cl.
CPC ....... *H10P 72/0432* (2026.01); *H05B 1/0233* (2013.01); *H05B 3/12* (2013.01); *H05B 3/143* (2013.01); *H10P 72/7624* (2026.01)

(58) Field of Classification Search
CPC ............... H01L 21/67; H01L 21/67098; H01L 21/67103; H01L 21/67109; H10P 72/0431; H10P 72/0432; H10P 72/7604; H10P 72/7624
USPC ...................................................... 219/444.1
See application file for complete search history.

(56) References Cited

U.S. PATENT DOCUMENTS

| 4,514,250 A * | 4/1985 | Hwang | .................... C30B 23/02 |
| | | | 117/106 |
| 6,444,957 B1 * | 9/2002 | Kitagawa | .......... H01L 21/67103 |
| | | | 219/544 |

| 6,956,186 B1 * | 10/2005 | Ito | ......................... H05B 1/0233 |
| | | | 219/465.1 |
| 7,106,416 B2 * | 9/2006 | Box | ..................... G03F 7/70875 |
| | | | 355/72 |
| 7,528,349 B1 * | 5/2009 | Gotkis | ................ G03F 7/70875 |
| | | | 118/724 |
| 11,101,152 B2 | 8/2021 | deVilliers | |
| 2002/0134776 A1 | 9/2002 | Furukawa et al. | |
| 2004/0007773 A1 | 1/2004 | Hiramatsu et al. | |
| 2006/0049168 A1 | 3/2006 | Lee et al. | |
| 2018/0226285 A1 * | 8/2018 | Hanamachi | ......... H10P 72/0432 |
| 2019/0287827 A1 | 9/2019 | de Villiers | |

(Continued)

FOREIGN PATENT DOCUMENTS

KR 20170118287 A 10/2017

OTHER PUBLICATIONS

"Low Melt/Fusible Alloys", RotoMetals.com, Jul. 25, 2021. Obtained on Aug. 15, 2025 from: https://web.archive.org/web/20210725132053/ https://www.rotometals.com/low-melt-fusible-alloys/ (Year: 2021).*

(Continued)

*Primary Examiner* — Alain Chau

(74) *Attorney, Agent, or Firm* — Slater Matsil, LLP

(57) ABSTRACT

According to an embodiment, an apparatus for a hot plate apparatus is disclosed. The hot plate apparatus includes a housing structure, an alloy, and a heating element. The housing structure includes an outer shell surrounding a cavity. The alloy is disposed of within the cavity. The alloy has a melting temperature range. The heating element is configured to transition the alloy from a solid state to a liquid state at a set temperature between the melting temperature range.

20 Claims, 2 Drawing Sheets

(56)        References Cited

U.S. PATENT DOCUMENTS

| | | | |
|---|---|---|---|
| 2022/0240351 A1* | 7/2022 | Chen ........................ | H05B 3/26 |
| 2022/0361296 A1* | 11/2022 | Bhatnagar ................ | H05B 3/56 |
| 2023/0084930 A1* | 3/2023 | Waldfried ........... | H01L 21/6833 |
| | | | 219/444.1 |
| 2024/0105498 A1* | 3/2024 | Im .................... | H01L 21/68785 |

OTHER PUBLICATIONS

"Cerrosafe", Wikipedia, The Free Encyclopedia, Apr. 18, 2021. Obtained on Aug. 15, 2025 from: https://web.archive.org/web/20210418070917/https://en.wikipedia.org/wiki/Cerrosafe (Year: 2021).*
"Rose's Metal", Wikipedia, The Free Encyclopedia, Apr. 10, 2021. Obtained on Aug. 15, 2025 from: https://web.archive.org/web/20210410204800/http://en.wikipedia.org/wiki/Rose's_metal (Year: 2021).*
International Search Report and Written Opinion, PCT/US2023/036453, mailed Feb. 24, 2024, Total pp. 11.

\* cited by examiner

OPERATING THE HOT PLATE IN A FIRST OPERATING MODE — 402

OPERATING THE HOT PLATE IN A FIRST OPERATING MODE — 404

OPERATING THE HOT PLATE IN A SECOND OPERATING MODE — 406

HIGH HEAT CAPACITY HOT PLATE

TECHNICAL FIELD

The present disclosure generally relates to semiconductor manufacturing and, in particular embodiments, to a hot plate used in, for example, semiconductor manufacturing.

BACKGROUND

Semiconductor manufacturing consists of several process steps to create a completed chip or integrated circuit. Such steps include creating a wafer, adding one or more films, depositing the photoresist, exposing the wafer to a pattern of actinic radiation, developing soluble portions of the photoresist, etching the wafer, and cleaning the wafer. This process can be executed several times until desired structures have been added and unwanted material has been removed. Afterward, a corresponding circuit can be tested.

Typically, among the steps for semiconductor manufacturing, there are several bake steps. For example, bake steps associated with photolithography processes are bake, pre-bake, post-exposure bake, and post-bake. These bake steps are commonly used with deposition and the setting of films such as photoresist and benefit from precise temperature control.

For example, when baking a wafer, the wafer chuck is heated using a hot plate to a temperature of within 0.1 degrees, such that the wafer is heated evenly across its entire surface area. Typically, the hot plate is set to the desired temperature, and the cold wafer is then introduced to the system. The system temperature drops upon the cold wafer's loading (i.e., introduction). The process requires a period to bring the system temperature to the desired value. It would be advantageous to have a hot plate that can reliably maintain the desired temperature upon loading the cold wafer.

SUMMARY

Technical advantages are generally achieved by embodiments of this disclosure which describe a hot plate used in, for example, semiconductor manufacturing with a high heat capacity.

A first aspect relates to a hot plate apparatus. The hot plate apparatus includes a housing structure, an alloy, and a heating element. The housing structure includes an outer shell surrounding a cavity. The alloy is disposed of within the cavity. The alloy has a melting temperature range. The heating element is configured to transition the alloy from a solid state to a liquid state at a set temperature between the melting temperature range.

In a first implementation form of the hot plate apparatus according to the first aspect as such, the alloy includes Bismuth (Bi), Lead (Pb), Tin (Sn), Cadmium (Cd), or a combination thereof.

In a second implementation form of the hot plate apparatus according to the first aspect as such or any preceding implementation form of the first aspect, the alloy consists of 42.5 to 50% Bismuth, 25 to 37.7% Lead, 11.3 to 25% Tin, and 0 to 8.5% Cadmium.

In a third implementation form of the hot plate apparatus according to the first aspect as such or any preceding implementation form of the first aspect, the alloy consists of 42.5% Bismuth, 37.7% Lead, 11.3% Tin, and 8.5% Cadmium.

In a fourth implementation form of the hot plate apparatus according to the first aspect as such or any preceding implementation form of the first aspect, the alloy consists of 50% Bismuth, 25% Lead, and 25% Tin.

In a fifth implementation form of the hot plate apparatus according to the first aspect as such or any preceding implementation form of the first aspect, the alloy is in the solid state at room temperature.

In a sixth implementation form of the hot plate apparatus according to the first aspect as such or any preceding implementation form of the first aspect, the outer shell is made of aluminum.

In a seventh implementation form of the hot plate apparatus according to the first aspect as such or any preceding implementation form of the first aspect, a thickness of the outer shell is less than or equal to 3 millimeters (mm).

In an eight implementation form of the hot plate apparatus according to the first aspect as such or any preceding implementation form of the first aspect, a top surface of the housing structure is configured to hold a wafer.

In a ninth implementation form of the hot plate apparatus according to the first aspect as such or any preceding implementation form of the first aspect, the outer shell hermetically seals the cavity.

In a tenth implementation form of the hot plate apparatus according to the first aspect as such or any preceding implementation form of the first aspect, the hot plate apparatus is configured to heat a wafer during a post-exposure bake (PEB) to the melting temperature range of the alloy.

A second aspect relates to a hot plate apparatus. The hot plate apparatus includes a housing structure and a heating element. The housing structure includes an outer shell surrounding a first cavity and a second cavity. The first cavity is filled with a first alloy having a first melting range. The second cavity is filled with a second alloy having a second melting range. The heating element is configured to bring the first alloy to a first temperature within the first melting range during a first operating mode of the hot plate apparatus. The heating element is configured to bring the second alloy to a second temperature within the second melting range during a second operating mode of the hot plate apparatus. The second temperature being higher than the first temperature.

In a first implementation form of the hot plate apparatus according to the second aspect as such, the first cavity includes a plurality of first channels. In this embodiment, the first alloy is uniformly spread through the plurality of first channels at the first temperature.

In a second implementation form of the hot plate apparatus according to the second aspect as such or any preceding implementation form of the second aspect, each of the plurality of first channels is coupled to each other via a first linking channel.

In a third implementation form of the hot plate apparatus according to the second aspect as such or any preceding implementation form of the second aspect, the second cavity includes a plurality of second channels, and the second alloy is uniformly spread through the plurality of second channels at the second temperature.

In a fourth implementation form of the hot plate apparatus according to the second aspect as such or any preceding implementation form of the second aspect, each of the plurality of second channels is coupled to each other via a second linking channel.

In a fifth implementation form of the hot plate apparatus according to the second aspect as such or any preceding implementation form of the second aspect, the first channels and the second channels are arranged in parallel to each other, and each first channel is arranged adjacent to a neighboring second channel.

A third aspect relates to a method for operating a hot plate in a first operating mode and a second operating mode. The hot plate includes a heating element, a housing structure with an outer shell surrounding a first cavity and a second cavity, a first alloy disposed within the first cavity and having a first melting temperature range, and a second alloy disposed within the second cavity and having a second melting temperature range. In the first operating mode, the method includes transitioning, by the heating element, the first alloy to a first temperature within the first melting temperature range, and in the second operating mode, the method includes transitioning, by the heating element, the second alloy to a second temperature within the second melting temperature range.

In a first implementation form of the method according to the third aspect as such, the first alloy and the second alloy each include Bismuth (Bi), Lead (Pb), Tin (Sn), Cadmium (Cd), or a combination thereof.

In a second implementation form of the method according to the third aspect as such or any preceding implementation form of the third aspect, the first alloy and the second alloy are in the solid state at room temperature.

Embodiments can be implemented in hardware, software, or in any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described to one of the embodiments may also apply to other embodiments. Further, it should be understood that various changes, substitutions, and alterations can be made herein without departing from the spirit and scope of this disclosure as defined by the appended claims.

While inventive aspects are described primarily in the context of a hot plate used in semiconductor manufacturing, the inventive aspects may be similarly applicable to fields outside the semiconductor industry. For example, a hot plate can be used for cooking, as a heat source in a laboratory, or the like. In these various examples and across industries, a hot plate that can reliability maintain the desired temperature with the introduction of an external device on the hot plate, as disclosed herein, is advantageous.

In embodiments, a hot plate is provided that includes a cavity in a housing structure. A non-eutectic alloy, having a melting temperature range, is disposed of within the cavity. A heating element of the hot plate transitions the non-eutectic alloy from a solid state to a liquid state at a set temperature between the melting temperature range of the alloy. The non-eutectic alloy begins to melt at the first melting temperature but does not turn to liquid (e.g., is between solid and liquid states) until a second melting temperature-greater than the first melting temperature. When the non-eutectic alloy is at a temperature within the melting temperature range, the specific heat capacity of the mixture is significantly greater than the specific heat capacity of the mixture in either the solid or liquid states.

Embodiments of this disclosure advantageously take benefit of this increased heat capacity by setting the hot plate to a temperature within the melting temperature range of the mixture. In this configuration, an external object with a different temperature, when placed on the surface of the hot plate, has minimal impact on the surface temperature.

Aspects of this disclosure provide a hot plate having multiple cavities, where different cavities include different non-eutectic mixtures. In such embodiments, the hot plate is able to take advantage of the increased heat capacity of each non-eutectic mixture at their corresponding melting temperature ranges. These and further details are discussed in greater detail below.

Figure 1:
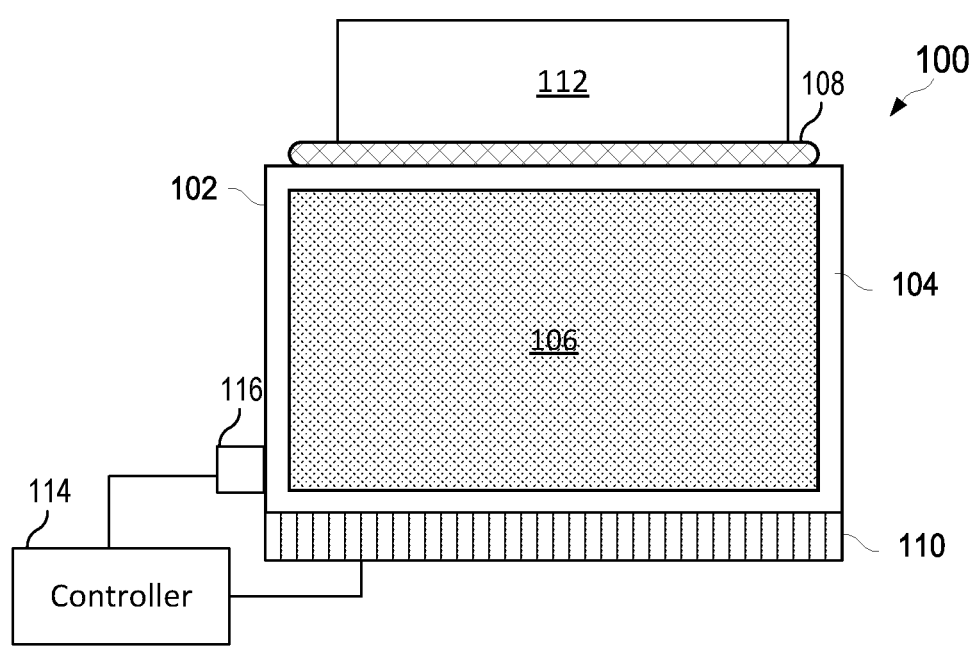
FIG. 1 is a block diagram of an embodiment hot plate.

FIG. 1 illustrates an embodiment hot plate 100. The hot plate 100 includes a housing structure 102, a top surface 108, and a heating element 110, which may (or may not) be arranged as shown. In embodiments, the hot plate is configured to heat a wafer 112 during a post-exposure bake (PEB). Further, hot plate 100 may include additional components not depicted in FIG. 1.

The housing structure 102 includes an outer shell 104 surrounding cavity 106. In embodiments, the outer shell 104 hermetically seals cavity 106. In embodiments, cavity 106 is an open volume within the housing structure 102 entirely surrounded by the outer shell 104, which holds an alloy, preferably a non-eutectic mixture. In embodiments, the outer shell is made of aluminum. In embodiments, the outer shell 104 is a thin clad of metal with a thickness of less than or equal to 3 millimeters (mm). Generally, the thickness of the clad of metal is preferred to be as thin as possible to increase heat capacity while maintaining structural rigidity.

The heating element 110 is thermally coupled to the housing structure. The heating element 110 radiates heat towards the top surface 108 of the hot plate through the housing structure 102. The housing structure 102 distributes the heat uniformly across the top surface 108 of the hot plate 100.

In embodiments, the heating element 110 has a serpentine shape encased in a separate housing.

In embodiments, the heating element 110 is electrically coupled to a temperature sensor 116 and a controller 114. The temperature sensor 116 is attached, for example, to the housing structure 102 or the top surface 108 of the hot plate. Controller 114, for example, monitors the temperature at the attached surface and sets the heating element to a corresponding desired temperature. In embodiments, a feedback circuit of controller 114 may be used to maintain the desired temperature.

The top surface 108 is used as a placement for an object to be heated at a set temperature. In embodiments, the top surface 108 is configured to hold a wafer for semiconductor processing. The shape of the top surface 108 is non-limiting, and any shape for the top surface 108 is contemplated.

In embodiments, the alloy within cavity 106 is a non-eutectic mixture having a melting point range between a first melting point and a second melting point. At a temperature below the first melting point (i.e., solidus temperature), the non-eutectic alloy is solid (e.g., not melted). At a temperature above the second melting point (i.e., liquidus temperature), the non-eutectic alloy is liquid (e.g., melted). As the alloy is a non-eutectic alloy, the first melting point is different from the second melting point.

Generally, in between the first and second melting points (i.e., melting temperature range), parts of the non-eutectic mixture are melted while other parts are not melted. At any point within the melting temperature range, the atoms of the non-eutectic mixture are not as rigidly packed in as they would be in the solid state, nor are they running around as freely and separately as they would be in the liquid state. In this in-between state, in addition to the kinetic energy, there exists additional potential energy resulting from the atoms pulling apart or squashing together (similar to springs). As a result, in this conditional state, the specific heat capacity of the non-eutectic mixture tends to be much higher in comparison to the specific heat capacity of the non-eutectic mixture in either the solid or liquid states.

Embodiments of this disclosure, advantageously, take advantage of the higher specific heat capacity of a non-eutectic mixture operating within the melting temperature range.

In embodiments, the alloy is a eutectic mixture having a single melting point value. In contrast to a non-eutectic mixture, in a eutectic mixture, the first melting point (i.e., solidus temperature) is the same as the second melting point (i.e., liquidus temperature). In such an embodiment, the benefits of the corresponding hot plate are limited to a single temperature (i.e., the melting temperature), which has a less practical use case in comparison to a hot plate having a non-eutectic mixture with a melting temperature range.

Similar to the non-eutectic mixture, the eutectic mixture has a much higher specific heat capacity at the melting point in comparison to the specific heat capacity in the solid or liquid states. However, unlike the non-eutectic mixture that has a melting temperature range, the eutectic mixture has a single melting point value. Thus, the advantages provided by this property are more limited in the case of the eutectic mixture.

In various embodiments, cavity 106 of the hot plate 100 includes a non-eutectic mixture. In response to the setting of the temperature of the hot plate to a temperature corresponding to a temperature within the melting temperature range of the non-eutectic mixture, parts of the non-eutectic mixture within cavity 106 become melted, while other parts of the non-eutectic mixture within the cavity 106 are not melted. The non-eutectic mixture is thermally coupled to the outer shell 104 of the housing structure 102, which in turn is thermally coupled to the top surface 108 of the hot plate 100. In this configuration, while the non-eutectic mixture is at a temperature within the melting temperature range, the specific heat capacity of the system (i.e., hot plate apparatus) is very high in comparison to the specific heat capacity of the system when the temperature is set to a value where the non-eutectic mixture is still in the solid state or the non-eutectic mixture is in the liquid state.

Further, the specific heat capacity of the system in this configuration is magnitudes greater than the specific heat capacity of a hot plate with a solid (i.e., no cavity) housing structure.

For example, a typical solid aluminum hot plate with a specific heat capacity of 3,492 J/kg° C., when configured with a housing structure having a cavity composed of a non-eutectic mixture, as disclosed herein (e.g., a mixture of bismuth (Bi), lead (Pb), tin (Sn), and cadmium (Cd), or a combination thereof) has a specific heat capacity of 29,250 J/kg° C.

Due to the increased specific heat capacity of the hot plate 100, when the temperature is set to a temperature point within the melting temperature range of the non-eutectic mixture, the placement of an object on the top surface 108 having a significantly different temperature than the set temperature of the hot plate 100 does not cause a significant drop in temperature at the top surface 108, in comparison to the conventional hot plate.

For example, when a cold (i.e., 23° C.) 300 mm diameter and 875 um thick silicon wafer (or any other similar material) is placed on a typical solid aluminum hot plate set to 80° C., the drop in temperature is about 2.9° C. In comparison, when the same cold wafer is placed on the hot plate 100, with substantially the same dimensions, set to the same 80° C. with a non-eutectic mixture of bismuth, lead, tin, and cadmium, or a combination thereof, the drop in temperature is about 0.5° C.

Thus, advantageously, the increased specific heat capacity of the non-eutectic mixture in cavity 106 allows, for example, the introduction of a cold wafer during a wafer bake while maintaining the desired temperature at the top surface 108. The embodiments of this disclosure, thus, minimize any undesired increase in time required to bring the temperature of the hot plate and the cold wafer back to the desired temperature after the introduction of the cold wafer.

Advantageously, by selecting a non-eutectic mixture based on its corresponding melting temperature range and the desired bake temperature of the wafer, the hot plate is able to substantially maintain the set temperature with the introduction of a cold wafer.

It should be noted that although the hot plate 100 can significantly benefit from a non-eutectic mixture having a melting temperature range within cavity 106—having a range of temperatures at which the hot plate 100 can operate—a hot plate with a eutectic alloy within the cavity 106 is similarly contemplated. However, unlike the non-eutectic mixture, the benefits of a hot plate having a eutectic mixture in cavity 106 would be limited to a single temperature (i.e., melting point of the eutectic mixture).

In embodiments, the alloy is a mixture of one or more of bismuth, lead, tin, and cadmium. It is noted that a non-eutectic mixture is not limited to such an alloy, and any non-eutectic mixture having a melting temperature range (as opposed to a eutectic mixture having a single melting temperature point) is contemplated.

In one embodiment, the alloy consists of 42.5 to 50% bismuth, 25 to 37.7% lead, 11.3 to 25% tin, and 0 to 8.5% cadmium.

In an embodiment, the alloy is Cerrosafe® (also known as Wood's metal, Bend alloy, or pewtalloy), which is a non-eutectic mixture consisting of 42.5% bismuth, 37.7% lead, 11.3% tin, and 8.5% cadmium. Cerrosafe® has a melting point between 158° F. (70° C.) and 190° F. (88° C.).

In another embodiment, the alloy is a non-eutectic mixture consisting of 50% bismuth, 25% lead, and 25% tin. In this embodiment, the alloy has a melting point between 199° F. (93° C.) and 239° F. (115° C.).

In embodiments, the ratio of the mixture of bismuth, lead, tin, and cadmium is adjusted to achieve the desired temperature range based on the application.

In embodiments, the alloy is in a solid state at room temperature.

Figure 2:
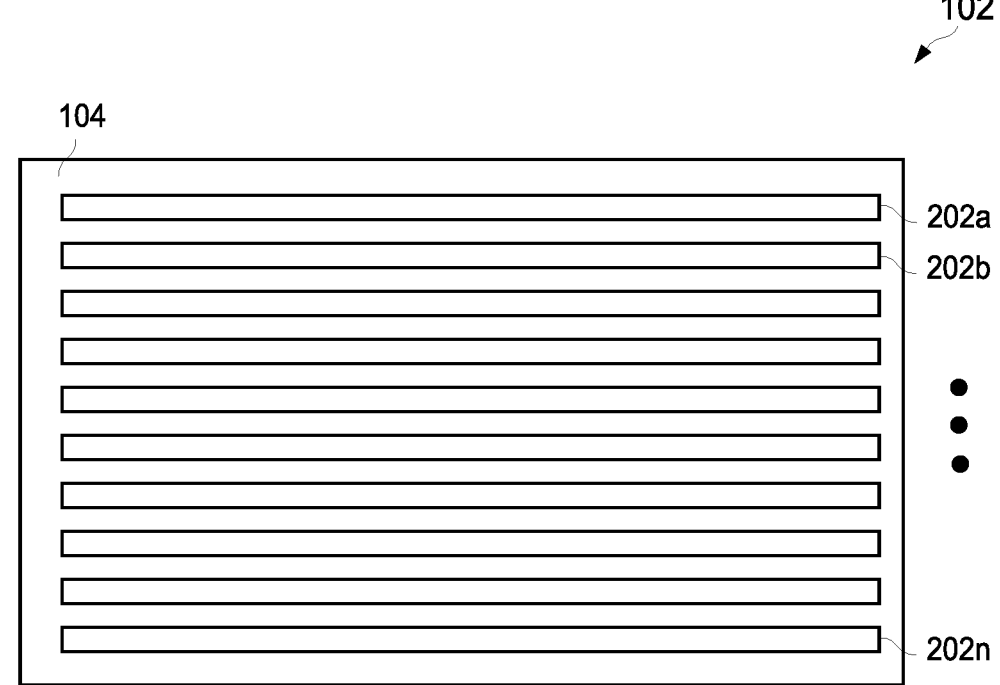
FIG. 2 is a cross-section top view of an embodiment housing structure with a plurality of cavities.

FIG. 2 illustrates a cross-section top view of an embodiment of housing structure 102 with a plurality of cavities 202a-n. As shown, the cavities 202a-n are evenly distributed across housing structure 102. In embodiments, each cavity 202a-n is hermetically sealed.

In embodiments, each cavity 202a-n includes one or more alloys of the eutectic or non-eutectic mixture. For example, in an embodiment, each cavity 202a-n may include the same non-eutectic mixture.

As another example, in an embodiment, every other cavity 202a-n may include a different non-eutectic mixture. For example, the first cavity 202a may include a first non-eutectic mixture, and the second cavity 202b may include a second non-eutectic mixture, with a repeating arrangement across the remaining cavities. In such an example, the hot plate 100 may, advantageously, have two different melting temperature ranges-one corresponding to the melting temperature range of the first non-eutectic mixture and a second corresponding to the melting temperature range of the second non-eutectic mixture.

It should be appreciated that other configurations with additional arrangements of non-eutectic mixtures may similarly be contemplated. Generally, the configuration of the arrangement may benefit from a uniform distribution of the variations across the cavities 202a-n; however, this is non-limiting, and other arrangements are similarly contemplated.

Figures 3, 4:
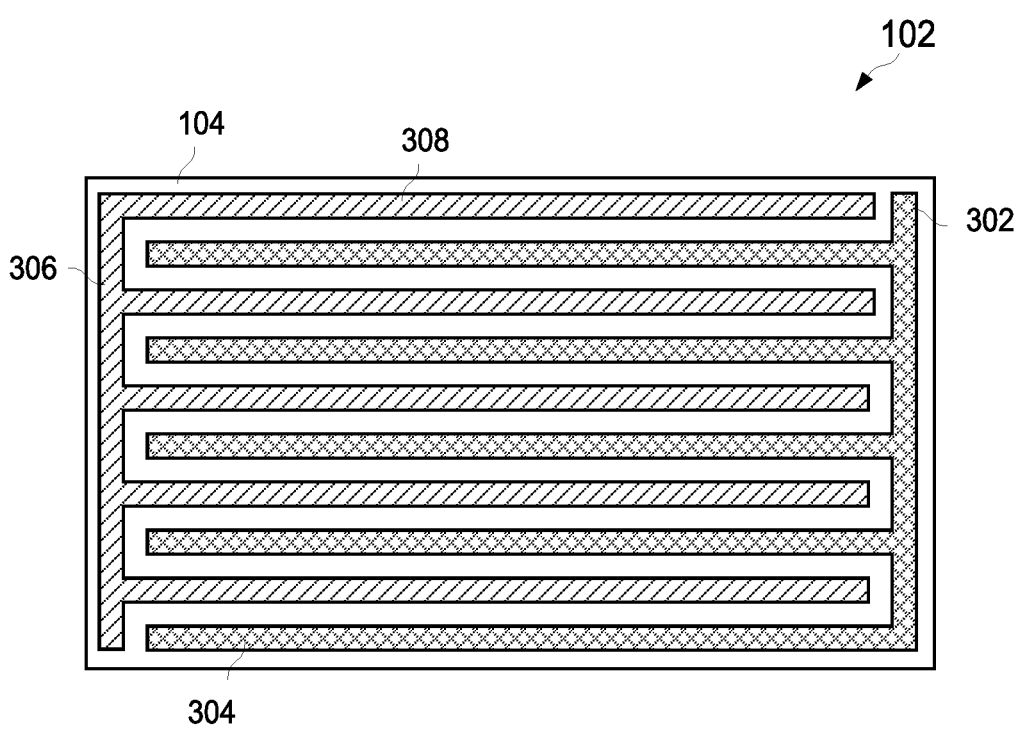
FIG. 3 is a cross-section top view of an embodiment housing structure having a first set of horizontal cavities paired with a first vertical cavity, and a second set of horizontal cavities paired with a second vertical cavity.
FIG. 4 is a flow diagram of an embodiment method of operation of a hot plate.

FIG. 3 illustrates another cross-section top view of an embodiment of the housing structure 102 having a first set of horizontal cavities 308 paired with a vertical cavity 306, and a second set of horizontal cavities 304 paired with a vertical cavity 302.

Cavities 306 and 308 are hermetically sealed, and a, for example, melted alloy within these cavities can freely flow therein. Likewise, Cavities 302 and 304 are hermetically sealed, and a, for example, melted alloy with these cavities can freely flow therein.

In an embodiment, cavities 302, 304, 306, and 308 have the same non-eutectic mixture, allowing the hot plate 100 to operate advantageously, as disclosed herein, across the melting temperature range of the non-eutectic mixture.

In another embodiment, cavities 302 and 304 include a first non-eutectic mixture and cavities 306 and 308 include a second non-eutectic mixture. In this embodiment, the hot plate 100 can operate advantageously, as disclosed herein, across two different melting temperature ranges of each of the non-eutectic mixtures.

For example, in an embodiment, the cavities 302 and 304 include a non-eutectic mixture consisting of 42.5% bismuth, 37.7% lead, 11.3% tin, and 8.5% cadmium, and cavities 306 and 308 include a non-eutectic mixture consisting of 50% bismuth, 25% lead, and 25% tin. In such an embodiment, the hot plate can advantageously operate at a temperate range between 158° F. (70° C.) and 239° F. (115° C.). This is in contrast with a hot plate only having a non-eutectic mixture consisting of 42.5% bismuth, 37.7% lead, 11.3% tin, and 8.5% cadmium, which operates, at the melting temperature range between 158° F. (70° C.) and 190° F. (88° C.). Likewise, this is in contrast with a hot plate only having a non-eutectic mixture consisting of 50% bismuth, 25% lead, and 25% tin, which operates at the melting temperature between 199° F. (93° C.) and 239° F. (115° C.).

As before, a uniform distribution of the cavities is beneficial but not limiting. Further cavity arrangements may similarly be contemplated to account for more even distribution and multiple melting temperature ranges for different non-eutectic mixtures.

Moreover, in each of FIGS. 2 and 3, multiple cavities may be arranged vertically (i.e., a sealed cavity on one plane and another sealed cavity on another plane between the first sealed cavity and the top surface 108) to provide the benefits of multiple non-eutectic mixtures in the hot plate 100.

FIG. 4 illustrates a flow diagram 400 of an embodiment method of operation of the hot plate 100. At step 402, an external object is placed on the hot plate 100. The temperature of the hot plate 100 is set such that the temperature of the non-eutectic mixture is between the melting temperature range. The introduction of the external object causes a temporary drop in the temperature of the hot plate 100.

In embodiments, optionally, a feedback circuit is used to adjust the heating element and to slightly increase the set temperature to account for the minimal amount of temperature drop resulting from the introduction of the external object.

At step 404, also applicable when the hot plate 100 includes a single non-eutectic mixture, the hot plate is set to a first temperature within the melting temperature range of a single or a first non-eutectic mixture—corresponding to a first operating mode.

At step 406, the hot plate is set to a second temperature within the melting temperature range of a second non-eutectic mixture—corresponding to a second operating mode. Additional operating modes are similarly contemplated.

It is noted that the order of steps shown in FIG. 4 is not absolutely required, so in principle, the various steps may be performed out of the illustrated order. Also, certain steps may be skipped, different steps may be added or substituted, or selected steps or groups of steps may be performed in a separate application.

Although embodiments of this disclosure were discussed with example of a eutectic system outside the eutectic point, embodiments of this application may also be applied to a solid solution having a miscibility gap, a eutectoid system outside the eutectoid point, or a peritectic/peritectoid system outside the peritectic/peritectoid point.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A hot plate apparatus, comprising:
a housing structure having an outer shell surrounding a first cavity and a second cavity;
a first alloy and a second alloy respectively disposed within the first cavity and the second cavity, the first alloy having a first melting temperature range, the second alloy having a second melting temperature range;
a heating element; and
a controller coupled to the heating element, the controller configured to:
transition, using the heating element, the first alloy to a first temperature within the first melting temperature range during a first operating mode of the hot plate apparatus, and
transition, using the heating element, the second alloy to a second temperature within the second melting temperature range during a second operating mode of the hot plate apparatus.

2. The hot plate apparatus of claim 1, wherein the first alloy and the second alloy each comprise Bismuth (Bi), Lead (Pb), Tin (Sn), Cadmium (Cd), or a combination thereof.

3. The hot plate apparatus of claim 2, wherein the first alloy and the second alloy each consist of 42.5 to 50% Bismuth, 25 to 37.7% Lead, 11.3 to 25% Tin, and 0 to 8.5% Cadmium.

4. The hot plate apparatus of claim 1, wherein the first alloy and the second alloy each consist of 42.5% Bismuth, 37.7% Lead, 11.3% Tin, and 8.5% Cadmium.

5. The hot plate apparatus of claim 1, wherein the first alloy and the second alloy each consist of 50% Bismuth, 25% Lead, and 25% Tin.

6. The hot plate apparatus of claim 1, wherein the first alloy and the second alloy are in the solid state at room temperature.

7. The hot plate apparatus of claim 1, wherein the outer shell is made of aluminum.

8. The hot plate apparatus of claim 1, wherein a thickness of the outer shell is less than or equal to 3 millimeters (mm).

9. The hot plate apparatus of claim 1, wherein a top surface of the housing structure is configured to hold a wafer.

10. The hot plate apparatus of claim 1, wherein the outer shell hermetically seals the first cavity and the second cavity.

11. The hot plate apparatus of claim 1, wherein the hot plate apparatus is configured to heat a wafer during a post-exposure bake (PEB) to the first melting temperature range or the second melting temperature range.

12. A hot plate apparatus, comprising:
a housing structure having an outer shell surrounding a first cavity and a second cavity, the first cavity filled with a first alloy having a first melting range, the second cavity filled with a second alloy having a second melting range different than the first melting range; and a heating element configured to bring the first alloy to a first temperature within the first melting range during a first operating mode of the hot plate apparatus and to bring the second alloy to a second temperature within the second melting range during a second operating mode of the hot plate apparatus, the second temperature being higher than the first temperature,
wherein, in the first operating mode, the heating element transitions the first alloy to the first temperature within the first melting range, and
wherein, in the second operating mode, the heating element transitions the second alloy to the second temperature within the second melting range.

13. The hot plate apparatus of claim 12, wherein the first cavity comprises a plurality of first channels, the first alloy uniformly spread through the plurality of first channels at the first temperature.

14. The hot plate apparatus of claim 13, wherein each of the plurality of first channels is coupled to each other via a first linking channel.

15. The hot plate apparatus of claim 13, wherein the second cavity comprises a plurality of second channels, the second alloy uniformly spread through the plurality of second channels at the second temperature.

16. The hot plate apparatus of claim 15, wherein each of the plurality of second channels is coupled to each other via a second linking channel.

17. The hot plate apparatus of claim 15, wherein the first channels and the second channels are arranged in parallel to each other, and each first channel is arranged adjacent to a neighboring second channel.

18. A method, comprising:
operating a hot plate in a first operating mode and a second operating mode, the hot plate comprising a heating element, a housing structure with an outer shell surrounding a first cavity and a second cavity, a first alloy disposed within the first cavity and having a first melting temperature range, and a second alloy disposed within the second cavity and having a second melting temperature range,
wherein, in the first operating mode, the method comprises transitioning, by the heating element, the first alloy to a first temperature within the first melting temperature range, and
wherein, in the second operating mode, the method comprises transitioning, by the heating element, the second alloy to a second temperature within the second melting temperature range.

19. The method of claim 18, wherein the first alloy and the second alloy each comprise Bismuth (Bi), Lead (Pb), Tin (Sn), Cadmium (Cd), or a combination thereof.

20. The method of claim 18, wherein the first alloy and the second alloy are in the solid state at room temperature.

* * * * *